United States Patent
Zhang et al.

(10) Patent No.: US 9,099,434 B2
(45) Date of Patent: Aug. 4, 2015

(54) HIGH VOLTAGE DEVICE

(71) Applicant: GLOBALFOUNDRIES Singapore Pte. Ltd., Singapore (SG)

(72) Inventors: Guowei Zhang, Singapore (SG);
Purakh Raj Verma, Singapore (SG);
Baofu Zhu, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/340,578

(22) Filed: Jul. 25, 2014

(65) Prior Publication Data

US 2014/0332884 A1    Nov. 13, 2014

Related U.S. Application Data

(62) Division of application No. 13/276,301, filed on Oct. 18, 2011, now Pat. No. 8,790,966.

(51) Int. Cl.
| | |
|---|---|
| *H01L 29/66* | (2006.01) |
| *H01L 29/40* | (2006.01) |
| *H01L 29/78* | (2006.01) |
| *H01L 29/06* | (2006.01) |
| *H01L 29/10* | (2006.01) |
| *H01L 29/45* | (2006.01) |
| *H01L 29/49* | (2006.01) |

(52) U.S. Cl.
CPC ........ *H01L 29/402* (2013.01); *H01L 29/66659* (2013.01); *H01L 29/7823* (2013.01); *H01L 29/7835* (2013.01); *H01L 29/0653* (2013.01); *H01L 29/1083* (2013.01); *H01L 29/456* (2013.01); *H01L 29/4933* (2013.01); *H01L 29/665* (2013.01)

(58) Field of Classification Search
None
See application file for complete search history.

(56) References Cited

U.S. PATENT DOCUMENTS

| | | | |
|---|---|---|---|
| 5,883,413 | A | 3/1999 | Ludikhuize |
| 6,448,611 | B1 | 9/2002 | Oh |
| 7,582,533 | B2 | 9/2009 | Ko |
| 7,601,600 | B2 * | 10/2009 | Ko et al. ............ 438/306 |
| 8,350,327 | B2 | 1/2013 | Chung et al. |
| 8,513,712 | B2 | 8/2013 | Chu et al. |
| 2003/0042541 | A1 | 3/2003 | Rumennik et al. |
| 2006/0194392 | A1 | 8/2006 | Nagaoka |
| 2009/0256199 | A1 | 10/2009 | Denison et al. |
| 2010/0052057 | A1 | 3/2010 | Chung et al. |
| 2010/0224885 | A1 | 9/2010 | Onose |

FOREIGN PATENT DOCUMENTS

DE    102004041198 A1    3/2006

* cited by examiner

*Primary Examiner* — Sonya D McCall Shepard
(74) *Attorney, Agent, or Firm* — Horizon IP Pte. Ltd.

(57) ABSTRACT

A method of forming a device is disclosed. The method includes providing a substrate having a device region. The device region includes a source region, a gate region and a drain region defined thereon. The substrate is prepared with gate layers on the substrate. The gate layers are patterned to form a gate in the gate region and a field structure surrounding the drain region. A source and a drain are formed in the source region and drain region respectively. The drain is separated from the gate on a second side of the gate and the source is adjacent to a first side of the gate. An interconnection to the field structure is formed. The interconnection is coupled to a potential which distributes the electric field across the substrate between the second side of the gate and the drain.

20 Claims, 15 Drawing Sheets

HIGH VOLTAGE DEVICE

CROSS-REFERENCE TO RELATED APPLICATION

This application is a divisional application which claims benefit of copending U.S. patent application Ser. No. 13/276,301, filed Oct. 18, 2011, which is herein incorporated by reference for all purposes.

BACKGROUND

Lateral Double-Diffused (LD) transistors have been widely employed in high voltage applications. The performance of the LD transistors depends on the drain-to-source on-resistance ($Rds_{on}$) as well as breakdown voltage. For example, low $Rds_{on}$ results in high switching speed while high breakdown voltage increases voltage capabilities.

Conventional techniques in achieving high breakdown voltage results in an increased distance between the drain and the gate. This, however, concomitantly increases $Rds_{on}$, undesirably decreasing switching speed.

The disclosure is directed to transistors with fast switching speed and high breakdown voltage.

SUMMARY

A method of forming a device is presented. The method includes providing a substrate having a device region. The device region includes a source region, a gate region and a drain region defined thereon. The substrate is prepared with gate layers on the substrate. The gate layers are patterned to form a gate in the gate region and a field structure surrounding the drain region. A source and a drain are formed in the source region and drain region respectively. The drain is separated from the gate on a second side of the gate and the source is adjacent to a first side of the gate. An interconnection to the field structure is formed. The interconnection is coupled to a potential which distributes the electric field across the substrate between the second side of the gate and the drain.

A method of forming a device is disclosed. The method includes providing a substrate having a device region. The device region includes a source region, a gate region and a drain region defined thereon. A drift well is formed in the substrate between the gate and drain region. Gate layers are deposited on the substrate and patterned to form a gate in the gate region and a field structure surrounding the drain region. A source and a drain are formed in the source region and drain region respectively. The drain is separated from the gate on a second side of the gate and the source is adjacent to a first side of the gate. An interconnection to the field structure is formed. The interconnection is coupled to a potential which distributes the electric field across the substrate between the second side of the gate and the drain.

A device is presented. The device includes a substrate having a device region. The device region comprises a source region, a gate region and a drain region defined thereon. The device also includes a field structure surrounding the drain region. A source and a drain are in the source region and drain region respectively. The drain is separated from the gate on a second side of the gate and the source is adjacent to a first side of the gate. The device also includes an interconnection to the field structure. The interconnection is coupled to a potential which distributes the electric field across the substrate between the second side of the gate and the drain.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices or integrated circuits (ICs). More particularly, some embodiments relate to high power devices. For example, high power devices include lateral double-diffused (LD) transistors, such as metal oxide transistors (MOS). The high power devices can be employed as switching voltage regulators for power management applications. The LD transistors can be easily integrated into devices or ICs. The devices or ICs can be incorporated into or used with, for example, consumer electronic products, particularly portable consumer products, such as cell phones, laptop computers and personal digital assistants (PDAs).

Figure 1A:
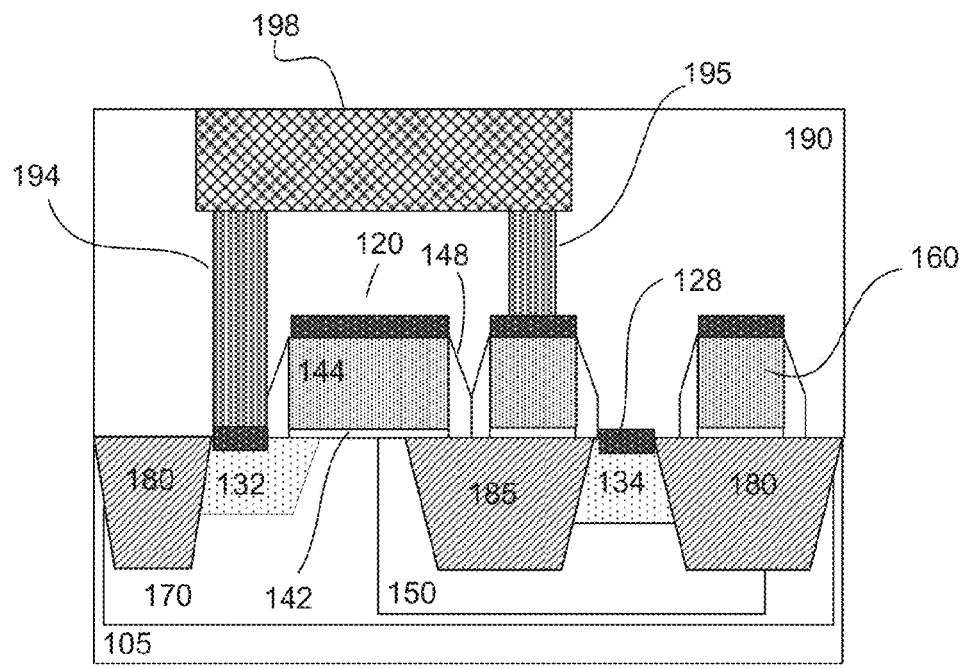
FIGS. 1a-b show an embodiment of a device.
Figure 1B:
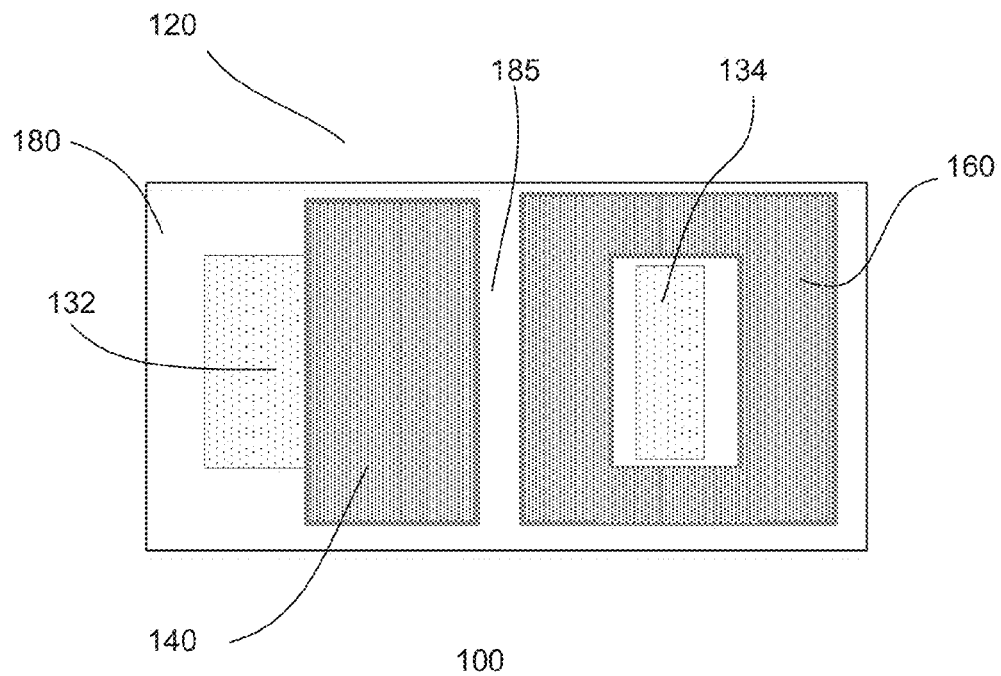

FIG. 1a shows a cross-sectional view of a portion 100 of an embodiment of a device and FIG. 1b shows a corresponding top view at the gate level. The device, for example, is an IC. Other types of devices may also be useful. As shown, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate maybe a doped substrate. For example, the substrate can be lightly doped with p-type dopants. Providing a substrate with other types of dopants or concentrations, including no dopants, may also be useful.

The device may include doped regions having different dopant concentrations. For example, the device may include heavily doped ($x^+$), intermediately doped (x) and lightly doped ($x^-$) regions, where x is the polarity type which can be p or n. A lightly doped region may have a dopant concentration of about $1E11$-$1E13/cm^2$, and an intermediately doped region may have a dopant concentration of about $1E13$-$E14/cm^2$, and a heavily doped region may have a dopant concentration of about $1E15$-$1E17/cm^2$. Providing other dopant concentrations for the different doped regions may also be useful. P-type dopants may include boron (B), aluminum (Al), indium (In) or a combination thereof, while n-type dopants may include phosphorous (P), arsenic (As), antimony (Sb) or a combination thereof.

The substrate includes a device region. The device region, for example, is a high voltage (HV) device region for a high voltage device, such as a high voltage transistor. In one embodiment, the device region includes a LD transistor 120.

Providing other types of devices in the device region may also be useful. The substrate may also include regions for other types of circuitry, depending on the type of device or IC. For example, the device may also include regions for intermediate voltage (IV) and low voltage (LV) voltage devices as well as an array region for memory devices.

Isolation regions may be provided for isolating or separating different regions of the substrate. In one embodiment, the device region is isolated from other regions by a device isolation region 180. For example, the device isolation region surrounds the device region. The isolation region, for example, is a shallow trench isolation (STI) region. Other types of isolation regions may also be employed. For example, the isolation region may be a deep trench isolation (DTI) region. The STI regions, for example, extend to a depth of about 2000-5000 Å. In the case of DTI regions, the depth may be about 1-10 μm. Providing isolation regions which extend to other depths may also be useful.

The transistor includes a gate 140 on the surface of the substrate. The width of the gate along a channel length direction of the transistor, for example, is about 0.5-10 μm. The gate, for example, includes a gate electrode 144 over a gate dielectric 142. The gate dielectric, for example, may be silicon oxide while the gate electrode may be polysilicon. The gate dielectric, for example, may be a high voltage gate dielectric having a thickness of about 30-1000 Å while the gate electrode may be about 500-5000 Å thick. In some embodiments, the gate electrode may be a doped electrode. For example, the gate electrode may be polysilicon doped with first polarity type dopants. Other types of gate dielectrics and gate electrodes as well as thicknesses may also be useful. For example, the gate dielectric may be a high k gate dielectric and/or the gate electrode may be a metal gate electrode. Other configurations of gate layers of the gate may also be useful.

The transistor also includes first and second doped regions 132 and 134 disposed in the substrate on first and second sides of the gate. For example, the first doped region is disposed on the first side of the gate and the second doped region is disposed on the second side of the gate. The doped regions, in one embodiment, are heavily doped with first polarity type dopants for a first type transistor. For example, the doped regions are heavily doped n-type $n^+$ regions for a n-type transistor. Providing heavily doped p-type ($p^+$) regions may also be useful for a p-type transistor. The heavily doped regions, for example, have a dopant concentration of about 1E15-1E16/$cm^2$. Other dopant concentrations for the doped regions may also be useful. The depth of the doped regions may be about 0.1-0.4 μm. Providing doped regions having other depths may also be useful. Additionally, it is not necessary that the first and second doped regions have the same depth.

In one embodiment, the first doped region serves as a source region of the transistor. The source region is adjacent to the first side and underlaps the gate. The underlap portion should be sufficient for the source region to be in communication with the channel under the gate. The underlap portion may be, for example, about 0.1-0.5 μm. An underlap portion which underlaps the gate by other amounts may also be useful. In one embodiment, the underlap portion of the source region is a lightly doped source (LDS) region.

Sidewalls of the gate may be provided with dielectric spacers 148. The dielectric spacers, for example, may be silicon oxide spacers. Other types of dielectric materials may also be useful, such as silicon nitride or a combination of dielectric materials or layers. For example, the spacers may be composite spacers. The spacers may include an offset spacer and main spacer. The offset spacers may facilitate forming the LDS region while the main spacers facilitate forming heavily doped source and drain regions. Other configurations of spacers may also be useful. For example, the spacer may be a single spacer. The LDS region is formed prior to forming the spacers while the spacers facilitate forming the heavily doped source and drain regions. In some cases, the transistor may also include halo regions. Halo regions are second polarity doped regions abutting the S/D regions proximate to the gate.

In some embodiments, a dielectric etch stop layer (not shown) is formed over the transistors. The etch stop layer, for example, is a silicon nitride etch stop layer. Other types of etch stop layers may also be useful. The etch stop layer should have a material which can be selectively removed from a dielectric layer 190 thereover. The etch stop layer facilitates in forming contact plugs to contact regions of the transistor, such as the gate electrode and doped regions. In some embodiments, the etch stop layer may also serve as a stress layer for applying a stress on the channel of the transistor to improve performance.

In one embodiment, an internal isolation region 185 is provided within the device region. The internal isolation region may be an STI region. Other types of isolation regions may also be useful. Preferably, the internal isolation region is the same type of isolation region as the device isolation region. Providing an internal isolation region which is different from the device isolation region may also be useful. The internal isolation region, for example, is disposed in the device region along a channel width direction of the transistor between the gate and drain. The internal isolation, for example, extends from one side to the other side of the device region along the channel width direction. Other configurations of the device and internal isolation regions may also be useful. As shown, the internal isolation region underlaps the gate. For example, the internal isolation region extends under the second side of the gate by about 0.1-0.3 μm. Providing an internal isolation region which extends under the second side of the gate by other width may also be useful. Providing the internal isolation region which underlaps the gate protects the edge of the gate dielectric from high electric field during operation. The width of the internal isolation region, for example, may be about 0.2-5 μm. Other widths may also be useful, depending on the drain voltage. The width and depth of the internal isolation region may determine a drift length of the transistor.

A drift well 150 is disposed in the substrate. The drift well, in one embodiment, is disposed in the device region. For example, the drift well is disposed between the gate and the drain region, under-lapping a portion of the gate. As shown, the drift well encompasses the drain and the internal device isolation region. In one embodiment, the depth or bottom of the drift well is below the drain region. In one embodiment, the depth or bottom of the drift well is below the device isolation and internal device isolation regions. In one embodiment, the drift well is contiguous and encompasses the drain region and at least overlaps a portion of the active region underneath the gate. The distance from the drain and around the internal isolation region to the channel under the gate is the drift distance of the transistor.

The drift well includes first polarity type dopants. In one embodiment, the dopant concentration of the drift well is lower than the dopant concentration of the drain. In one embodiment, the drift well may be lightly ($x^-$) or intermediately (x) doped with first polarity type dopants. For example, the dopant concentration of the drift well is about 1E12-1E14/$cm^2$. Other dopant concentrations may also be useful. For example, the dopant concentration may depend on the maximum or breakdown voltage requirement of the device. The depth of the drift well may be about 0.1-5 µm depending on the design voltage of the device.

Figure 1C:
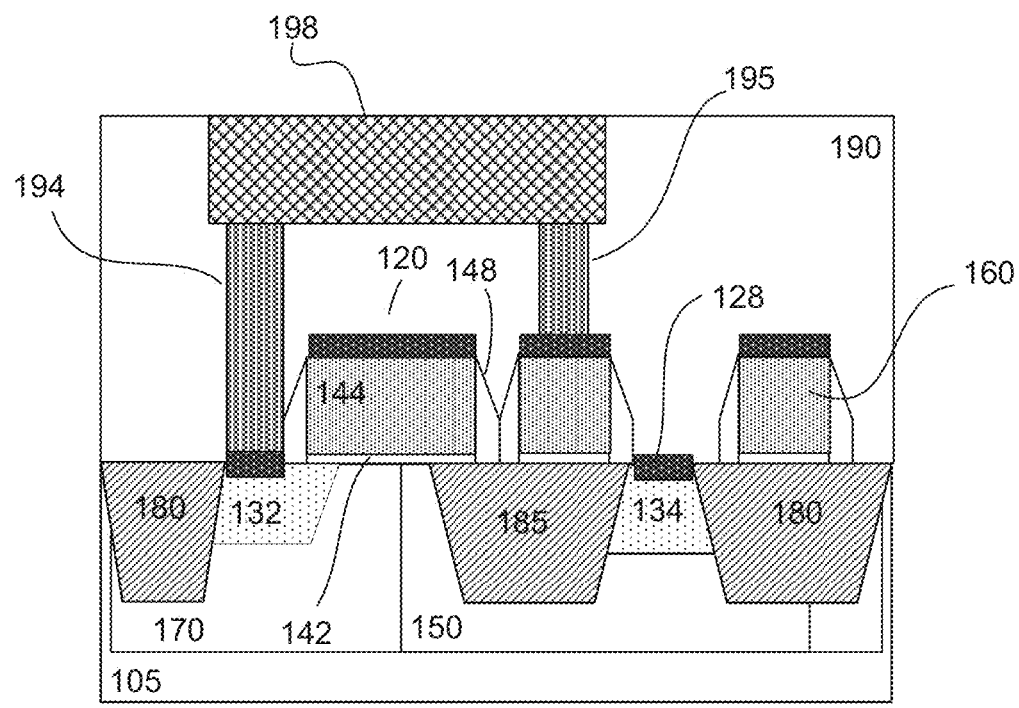
FIG. 1c shows another embodiment of a device.

A device well 170 is disposed in the substrate. In one embodiment, the device well is disposed within the device isolation region. For example, the device well is disposed within the device isolation region, encompassing the source, drain, drift well and internal device isolation region. In one embodiment, the depth or bottom of the device well is below the source, drain and drift well. In one embodiment, the depth or bottom of the device well is below the device isolation region and internal device isolation region. Providing a device well which is shallower than or at the same depth as the drift well may also be useful. In one embodiment, the device well has about the same depth as the drift well, as shown in FIG. 1c. For example, the device well may be on both sides of the drift well. Other configurations of the device and drift well may also be useful. For example, the drift well may only be on one side of the drift well encompassing the source region and channel of the device.

The device well includes second polarity dopants for a first polarity type device. For example, the device well comprises p-type dopants for an n-type device or n-type dopants for a p-type device. The dopant concentration may depend on the voltage requirement of the device. The device well may be lightly (x) or intermediately (x) doped with first polarity type dopants. Other dopant concentration for the device well, for example, dopant concentration greater than that of the lightly doped substrate, may also be useful.

Salicide contacts 128 may be formed on the gate electrode of the gate and source and drain regions. The salicide contacts, for example, may be nickel-based contacts. Other types of metal salicide contacts may also be useful. For example, the salicide contact may be cobalt silicide (CoSi). The salicide contacts may be about 100-500 Å thick. Other thickness of salicide contacts may also be useful. The salicide contacts may be employed to reduce contact resistance and facilitate contact to the back-end-of-line metal interconnects.

During operation of the transistor, the first doped region will have a first potential while the second doped region will have a second opposite potential. The second potential, for example, is with respect to the first potential. The first potential, for example, may be a low potential while the second potential may be a high potential. Providing a first potential which is a high potential and a second potential which is a low potential may also be useful. For example, in the case of a n-type transistor, the source is at a low potential, such as ground or 0V while the drain is at a high potential, such as 6-30 V, during operation. Other values for the high and low potentials may also be useful, depending on the operating parameters of the transistor. Since the drain has a higher potential than the gate, the drain side of the gate has high impact ionization due to the high electric field. For a p-type transistor, the drain is at a low potential, such as ground or 0 V while the source and gate are at a high potential, such as 6-30 V. Other values for the high and low potentials may also be useful, depending on the operating parameters of the transistor. The high voltage at the source or drain can cause breakdown of the dielectric layer, which renders the transistor inoperable.

In one embodiment, a field structure 160 is provided. The field structure, in one embodiment, is a conductive ring structure disposed on the substrate and surrounds the drain of the transistor. For example, the ring structure is disposed on the internal isolation region and device isolation region surrounding the drain. The field structure serves to distribute the electric field across the substrate between the drain and the gate. This reduces impact ionization at the gate edge, which improves gate dielectric breakdown voltage.

The field structure, during operation, is coupled to an opposite potential than the drain. For example, if the drain is at a high potential relative to the source, then the field structure is coupled to a low potential. In the case where the drain is at a low potential, than the field structure is coupled to a high potential. In one embodiment, the field structure is coupled to the source. For example, the field structure is coupled to the first potential. In another embodiment, the field structure is coupled to the substrate or the device well. In other embodiments, the field structure is coupled either to the substrate or the source, depending on which results in the larger voltage differential. In yet other embodiments, the field structure may be coupled to both the source and substrate, in the case where the source and substrate are at the same potential. Coupling the field structure to an opposite potential independent of the source and/or the substrate may also be useful. Other configurations of providing the field structure with an opposite potential than the drain is also useful.

In one embodiment, in the case of a n-type transistor, the field structure is coupled to a low potential, such as ground or 0 V. Coupling the field structure to other potential which is lower than the drain potential may also be useful. In the case of a p-type transistor, the field structure is coupled to a high potential, such as 6-30 V. In both n and p-types transistors, the greater the difference between the potentials at the field structure and the drain, the better the distribution of electric field between the gate and drain. This reduces impact ionization at the gate, improving or increasing the dielectric breakdown voltage.

The field structure, in one embodiment, is formed of a conductive material. The conductive material, for example, may be polysilicon. In one embodiment, the conductive material is doped polysilicon. Other types of conductive materials, such as metals, may also be used. In a preferred embodiment, the field structure has the same composition as the gate of the transistor. For example, the field structure may include a gate dielectric with a gate electrode thereover. A silicide contact may also be provided over the field structure, like the gate. Providing a field structure which has the same composition as the gate simplifies the process. For example, the gate and field structure can be formed simultaneously. In other embodiments, the field structure may have a different composition from the gate.

A conductive line 198 disposed in a dielectric layer 190 may be used to couple the source and field structure by contact plugs 194 and 195. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer should be capable of selectively etched or patterned with respect to the etch stop layer.

The dielectric layer includes upper and lower portions. The upper portion serves as an intra-metal dielectric (IMD) layer in which conductive lines are formed. The lower portion serves as an interlevel dielectric (ILD) layer in which contact plugs are formed. In one embodiment, the ILD layer is a pre-metal dielectric (PMD) layer in which contact plugs are formed to contact regions on the substrate, such as contact regions to the transistors, including the source, drain and gate.

In one embodiment, the upper and lower portions are separate portions. For example, the conductive lines and plugs are formed using separate processes, such as single damascene processes. Other techniques for forming the conductive lines and plugs may also be useful. For example, reactive ion etch (RIE) techniques may also be used or a combination of RIE and damascene techniques may also be useful.

For the case where the contact plugs and conductive lines are formed using separate processes, the conductive materials of the plugs and lines may be different. In one embodiment, the contact plugs are tungsten (W) plugs while the conductive lines are copper lines. Other types of materials for the plugs and conductive lines are also useful. For example, the conductive lines may be aluminum lines. In other embodiments, the conductive plugs and lines may be formed using a dual damascene process. In such cases, the conductive plugs and lines are of the same material.

The presence of the field structure disperses the electric field across the substrate between the drain and the gate to reduce impact ionization at the gate edge. This improves gate dielectric breakdown voltage without increasing the distance between the gate and drain which increases $Rds_{on}$.

Figure 2A:
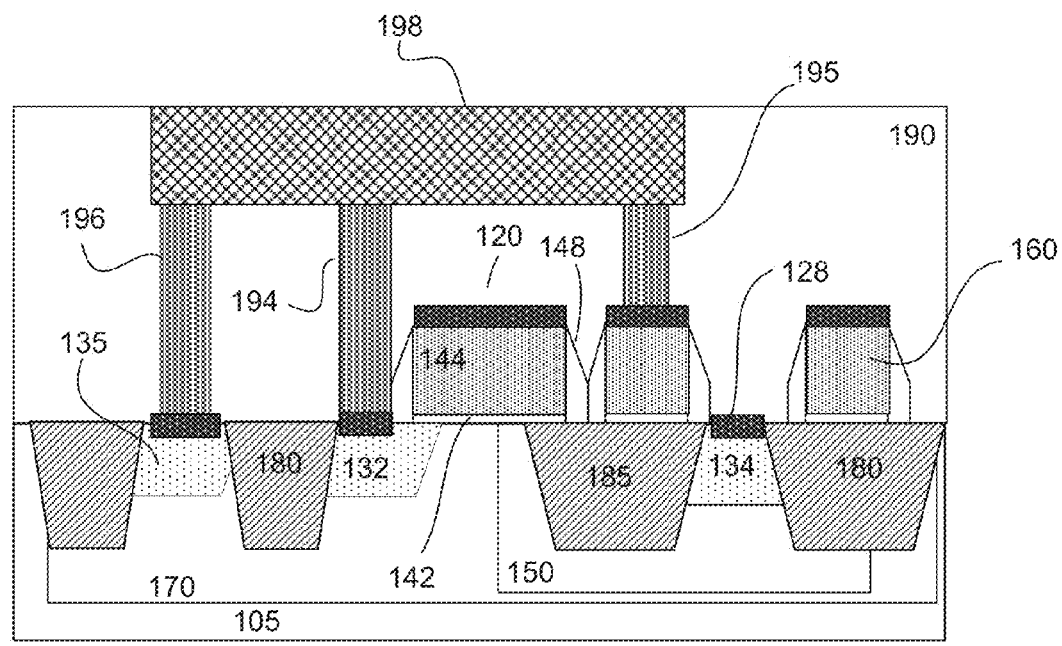
FIGS. 2a-b show yet another embodiment of a device.
Figure 2B:
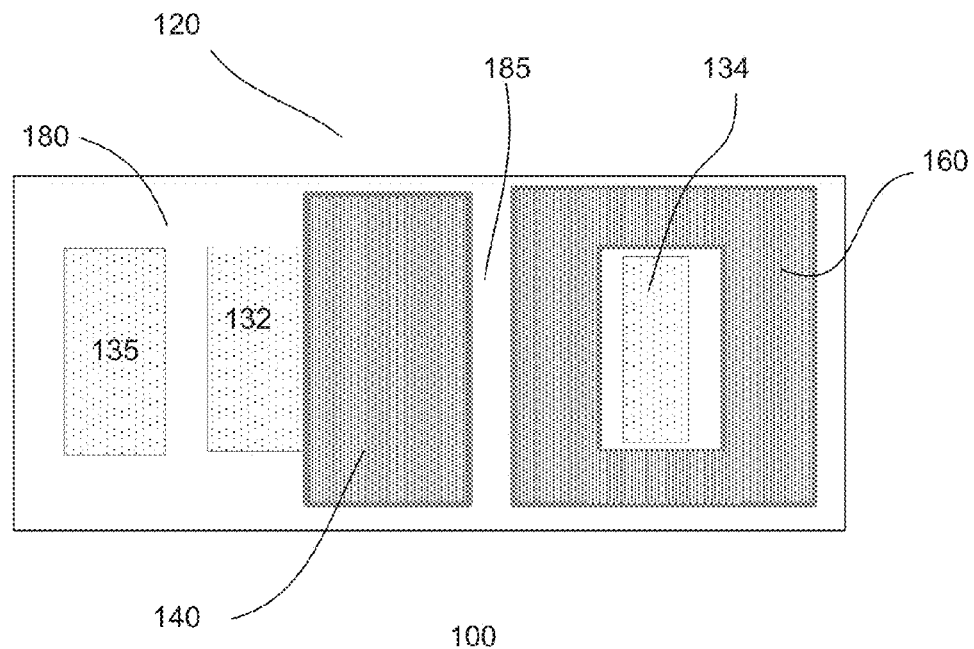

FIG. 2a shows a cross-sectional view of a portion 100 of another embodiment of a device and FIG. 2b shows a corresponding top view at the gate level. The device is similar to that shown in FIGS. 1a-b. As such, similar features may not be described or described in detail. In one embodiment, the device is formed on a substrate 105. The substrate, for example, is a silicon substrate. Other types of semiconductor substrates may also be useful. In one embodiment, the substrate is a p− substrate. Providing a substrate having other types of dopants or dopant concentrations, including an undoped substrate, may also be useful.

The substrate includes a first polarity type drift well 150 and a second polarity type device well 170. The drift well encompasses the drain 134 and underlaps a portion of the gate from the second side. The device well encompasses the source 132 and the channel of the transistor. The wells, for example, may be lightly or intermediately doped with respective polarity type dopants. In one embodiment, the drift well is disposed within the device well. For example, the depth of the device well is deeper than the drift well. In other embodiments, device and drift wells are about the same depth. For example, the device well may be on both sides of the drift well. Other configurations of the device and drift well may also be useful. The drift well, for example, may only be on one side of the drift well encompassing the source region and channel of the device.

In one embodiment, a well contact 135 is provided. The well contact is disposed in the device well from a surface portion of the substrate. The well contact, in one embodiment, is heavily doped with second polarity typed dopants. For example, the well contact region is a $p^+$ contact for an n-type transistor. Providing a $n^+$ contact may also be useful for a p-type transistor. Other dopant concentrations for the well contact may also be useful. The depth of the well contact, for example, may be about the same as the source or drain. Providing a contact having other depths may also be useful. The well contact provides a contact to the device well to, for example, bias the device well.

The well contact, in one embodiment, is isolated from the source by an internal isolation region 185. In some embodiments, no internal isolation region is provided to separate the well contact and source. Other configurations of the source and well contact may also be useful.

In one embodiment, the well contact, the source and the field structure 160 are commonly coupled. For example, a conductive line 198 disposed in a dielectric layer 190 may be used to commonly couple the source, field structure and well tap region by contact plugs 194, 195 and 196. The device well, source and field structure, for example, may be coupled to the second opposite potential. In other embodiments, the field structure may be coupled to either the device well contact or the source. Other configurations of coupling the well contact, source and field structure may also be useful.

Figure 3A:
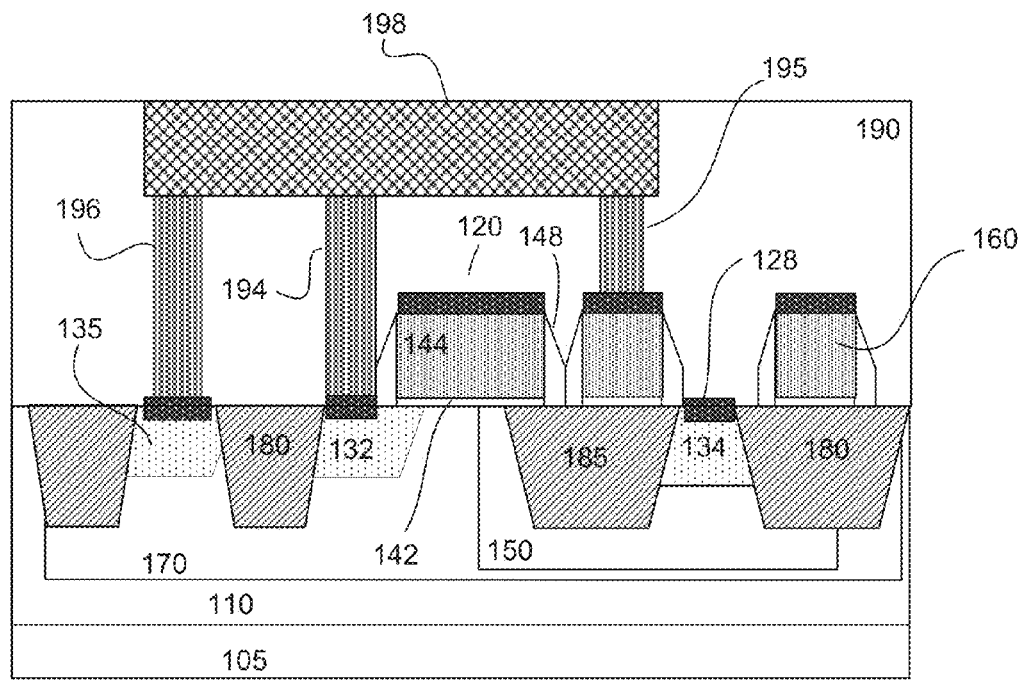
FIGS. 3a-b show other embodiments of a device.
Figure 3B:
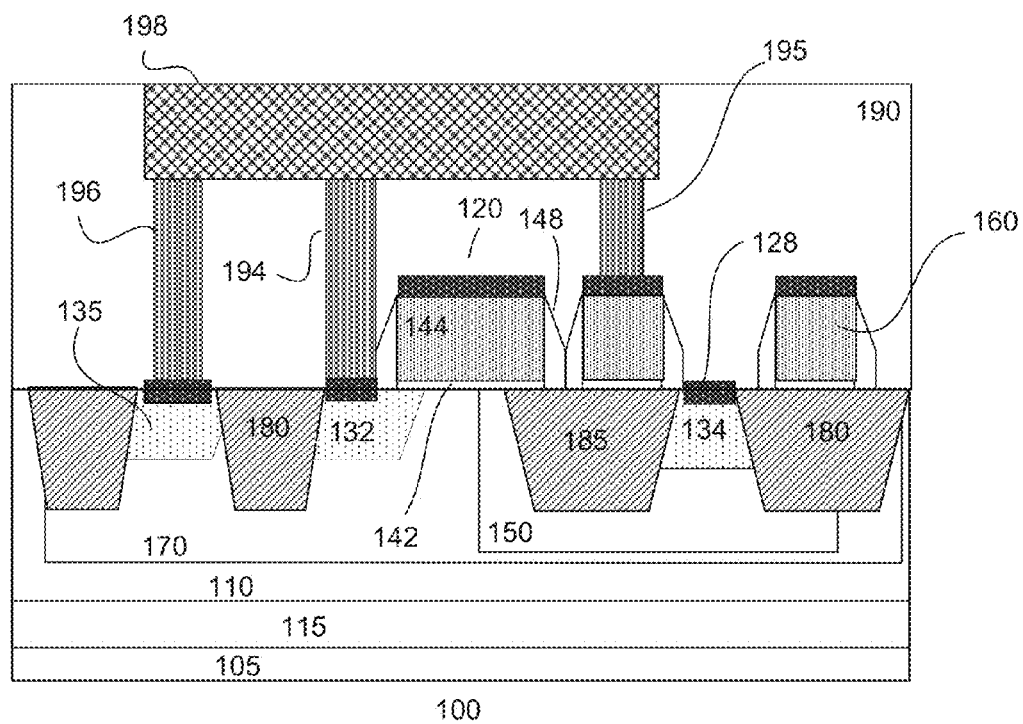

FIGS. 3a-b show cross-sectional views of other embodiments of devices 100. The devices are similar to those shown in FIGS. 1a-b and FIGS. 2a-b. As such, similar features may not be described or described in detail.

Referring to FIG. 3a, the device is formed on a base substrate 105. The substrate, for example, is a silicon base substrate. Providing other types of base substrates may also be useful. In one embodiment, the base substrate is a $p^+$ base substrate. Providing a base substrate having other types of dopants or dapant concentrations, including an undoped base substrate, may also be useful.

In one embodiment, a surface substrate 110 is provided over the base substrate. The surface substrate, for example, is a silicon surface substrate. The surface substrate may be a silicon epitaxial (epi) surface substrate. Other types of surface substrates may also be useful. The surface substrate, in one embodiment, is a $p^-$ surface substrate. Providing a surface substrate having other types of dopants or dopant concentrations, including an undoped base substrate, may also be useful.

The surface substrate includes a first polarity type drift well 150 and a second polarity type device well 170. In one embodiment, the surface substrate should be sufficiently thick to accommodate the drift and device wells. The drift well encompasses the drain 134 and underlaps a portion of the gate from the second side. The device well encompasses the source 132 and the channel of the transistor. The wells, for example, may be lightly or intermediately doped with respective polarity type dopants. In one embodiment, the drift well is disposed within the device well. For example, the depth of the device well is deeper than the drift well. In other embodiments, device and drift wells are about the same depth. For example, the device well may be on both sides of the drift well. Other configurations of the device and drift well may also be useful. The drift well, for example, may only be on one side of the drift well encompassing the source region and channel of the device.

In one embodiment, a well contact 135 is provided. The well contact is disposed in the device well from a surface portion of the substrate. The well contact, in one embodiment, is heavily doped with second polarity typed dopants. For example, the well contact region is a $p^+$ contact for an n-type transistor. Providing a $n^+$ contact may also be useful for a p-type transistor. Other dopant concentrations for the well contact may also be useful. The depth of the well contact, for example, may be about the same as the source or drain. Providing a contact having other depths may also be useful. The well contact provides a contact to the device well to, for example, bias the device well.

The well contact, in one embodiment, is isolated from the source by an internal isolation region 185. In some embodiments, no internal isolation region is provided to separate the well contact and source. Other configurations of the source and well contact may also be useful.

In one embodiment, the well contact, the source and the field structure 160 are commonly coupled. For example, a conductive line 198 disposed in a dielectric layer 190 may be used to commonly couple the source, field structure and well tap region by contact plugs 194, 195 and 196. The device well, source and field structure, for example, may be coupled to the second opposite potential. In other embodiments, the field structure may be coupled to either the device well contact or the source. Other configurations of coupling the well contact, source and field structure may also be useful.

Referring to FIG. 3b, the device is formed on a base substrate 105. The substrate, for example, is a silicon base substrate. Providing other types of base substrates may also be useful. In one embodiment, the base substrate is a $p^-$ base substrate. Providing a base substrate having other types of dopants or dopant concentrations, including an undoped base substrate, may also be useful.

In one embodiment, a surface substrate 110 is provided over the base substrate. The surface substrate, for example, is a silicon surface substrate. The surface substrate may be a silicon epitaxial (epi) surface substrate. Other types of surface substrates may also be useful. The surface substrate, in one embodiment, is a $p^-$ surface substrate. Providing a surface substrate having other types of dopants or dopant concentrations, including an undoped base substrate, may also be useful.

The over substrate, in one embodiment, is provided with an opposite polarity type buried well 115 than the base and surface substrates. The opposite polarity type buried well, for example, is a heavily doped opposite polarity type buried well. The opposite polarity type buried well, for example, is a $n^+$ buried well for p-type surface and base substrates. For example, the surface substrate is a p– surface substrate, the buried well is a $n^+$ buried well and the base substrate is a $p^-$ base substrate. The buried well may be a part of the base substrate. For example, the buried well may be formed by implanting dopants into the base substrate. Other configurations of the surface substrate, buried well and base substrate are also useful.

The surface substrate, in one embodiment, includes a first polarity type drift well 150 and a second polarity type device well 170. In one embodiment, the surface substrate should be sufficiently thick to accommodate the drift and device wells. The drift well encompasses the drain 134 and underlaps a portion of the gate from the second side. The device well encompasses the source 132 and the channel of the transistor. The wells, for example, may be lightly or intermediately doped with respective polarity type dopants. In one embodiment, the drift well is disposed within the device well. For example, the depth of the device well is deeper than the drift well. In other embodiments, device and drift wells are about the same depth. For example, the device well may be on both sides of the drift well. Other configurations of the device and drift well may also be useful. The drift well, for example, may only be on one side of the drift well encompassing the source region and channel of the device.

In one embodiment, a well contact 135 is provided. The well contact is disposed in the device well from a surface portion of the substrate. The well contact, in one embodiment, is heavily doped with second polarity typed dopants. For example, the well contact region is a $p^+$ contact for an n-type transistor. Providing a $n^+$ contact may also be useful for a p-type transistor. Other dopant concentrations for the well contact may also be useful. The depth of the well contact, for example, may be about the same as the source or drain. Providing a contact having other depths may also be useful. The well contact provides a contact to the device well to, for example, bias the device well.

The well contact, in one embodiment, is isolated from the source by an internal isolation region 185. In some embodiments, no internal isolation region is provided to separate the well contact and source. Other configurations of the source and well contact may also be useful.

In one embodiment, the well contact, the source and the field structure 160 are commonly coupled. For example, a conductive line 198 disposed in a dielectric layer 190 may be used to commonly couple the source, field structure and well tap region by contact plugs 194, 195 and 196. The device well, source and field structure, for example, may be coupled to the second opposite potential. In other embodiments, the field structure may be coupled to either the device well contact or the source. Other configurations of coupling the well contact, source and field structure may also be useful.

It is understood that the various substrate configurations of FIGS. 3a-b may also be applicable to the device of FIGS. 1a-c. In other embodiments, the substrate may be a crystalline on insulator (COI) type of substrate, such as a silicon-on-insulator (SOI) substrate. A COI substrate includes base and surface substrates separated by a buried insulator layer. Furthermore, the various configurations of wells as well as other features can be applied to the different embodiments of the device.

Figure 4A:
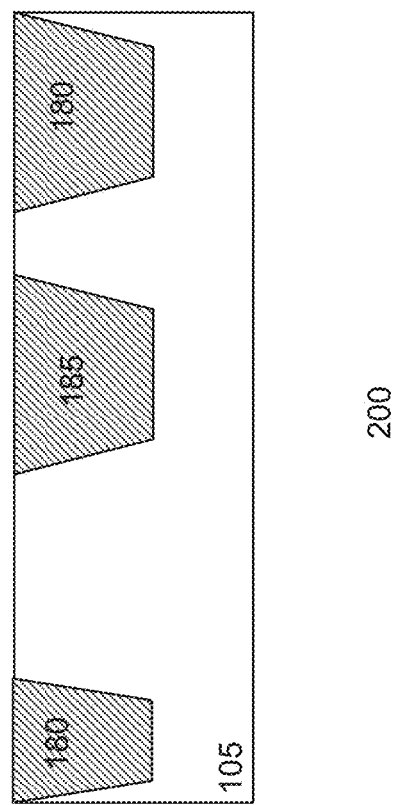
FIGS. 4a-i show an embodiment of a process for forming a device.

FIGS. 4a-h show cross-sectional views of an embodiment of a process for forming a device 200. Referring to FIG. 4a, a substrate 105 is provided. The substrate, in one embodiment, is a silicon substrate. The substrate may be a doped substrate, such as a $p^-$ substrate. Other types of substrates, such as a germanium-based, gallium arsenide, COI such as SOI, or sapphire, may also be useful. The substrates may be doped with other types of dopants or dopant concentrations.

In some embodiment, the substrate may include a base substrate with an surface substrate disposed thereon. The base and surface substrates may be, for example, silicon. In one embodiment, the surface substrate is an epi surface substrate. Other types of semiconductor materials for the base and surface substrates may also be useful. It is understood that the base and surface substrates need not be the same material.

In one embodiment, the base substrate is a $p^+$ substrate and the surface substrate is a $p^-$ substrate. Providing substrates with other dopant concentrations or different types of dopants, including no dopants, may also be useful. In some embodiments, a buried well of the opposite polarity as the surface substrate may be provided. The buried well, for example, may be a heavily doped well of the opposite polarity as the surface substrate. In one embodiment, a $n^+$ buried well is to separate the p– surface epi substrate from a p– base substrate. The $n^+$ buried well may be a part of the base substrate. Other configurations of base substrate, surface substrate and buried well may also be useful.

As shown, a device region is defined on the substrate. Although one device region is shown, it is however understood that the substrate may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (IV) devices and low voltage (LV) devices. Other configurations of logic regions may also be useful. Additionally, other types of device regions may also be provided.

In one embodiment, the device region is a HV region. The device region, for example, serves as a device region for a LD transistor. Providing a device region for other types of devices may also be useful. The device region is separated from other regions by a device isolation region 180. The device isolation region surrounds the device region. In one embodiment, the device region also includes an internal device isolation region 185 to separate the device region into first and second device sub-regions. For example, the internal device isolation region separates the device region into first and second sub-regions on the surface of the substrate.

In one embodiment, an internal isolation region 185 is provided within the device region. The internal isolation region, for example, is disposed in the device region along a channel width direction of the transistor between the gate and drain. The internal isolation, for example, extends from one side to the other side of the device region along the channel width direction.

The isolation regions are, for example, STIs. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STIs may be, for example, about 2000-6000 Å. Other depths for the STIs may also be useful. In other embodiments, the isolation may be other types of isolation regions. Also, the device and internal isolation regions may be different types of isolation regions.

Figure 4B:
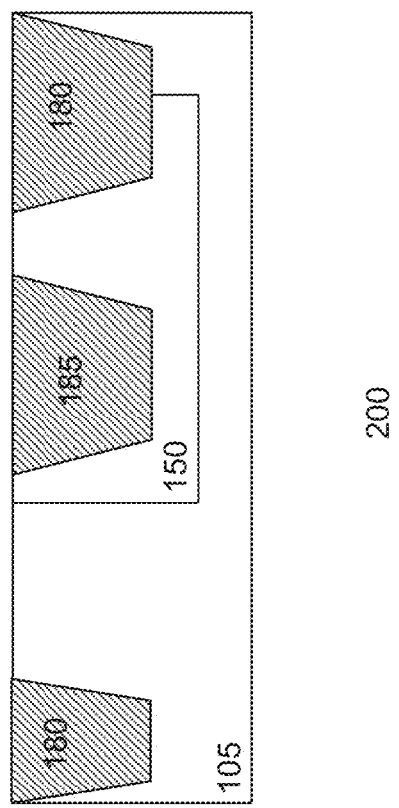

As shown in FIG. 4b, a doped well 150 is formed in the device region. The doped well serves as a drift well for the device. In one embodiment, the drift well is disposed in a portion of the device region. The drift well, for example, encompasses the internal isolation region and a portion of the device isolation region on a second side of the device region. The depth of the drift well, for example, may be about 0.1-5 μm. Providing a drift well of other depths may also be useful. The depth of the drift well, for example, may depend on the device operation voltage. The drift well includes first polarity type dopants for a first polarity type device. For example, a n-type drift well is provided for a n-type device. The n-type drift well, for example, may include phosphorus dopants. Forming a p-type drift well for a p-type device may also be useful. In one embodiment, the drift well may be lightly or intermediately doped with first polarity type dopants. Other dopant concentration for the first drift well may also be useful.

Figure 4C:
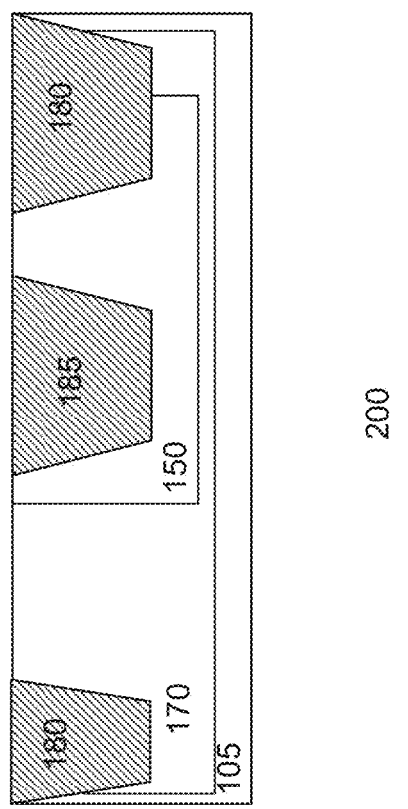

In some embodiment, a device doped well is formed in the device region, as shown in FIG. 4c. The device well serves as a body well for the transistor. The device well includes second polarity type dopants. In one embodiment, the device well is a lightly doped device well. For example, the dopant concentration of the device well is about $1E13$-$1E14/cm^2$. The device well, in one embodiment, encompasses the drift well and internal isolation region. In one embodiment, the device well encompasses a portion of the device isolation region, internal isolation region and drift well. The depth of the device well, for example, is about 0.5-6 μm. Other depths for the device well may also be useful. In other embodiments, the device well and drift well may have about the same depth. For example, the device well may be on both sides of the drift well. Other configurations of the device and drift well may also be useful. The drift well, for example, may only be on one side of the drift well encompassing the source region and channel of the device.

To form a doped well, an implant mask which exposes the device region is used. The implant mask, for example, comprises photoresist patterned by a lithographic mask. Dopants are implanted into the substrate using the implant mask. The dopants are implanted with the appropriate dose and power. Separate implant processes with respective implant masks are used to form doped wells of different polarity types. For example, separate processes are used to form the drift and device wells. In one embodiment, the device well is formed prior to forming the drift well. In some embodiments, a doped well may be formed by, for example, performing multiple implants at different energies. For example, the device well may be formed using multiple implant processes. Other configurations of implant processes may also be employed to form the wells.

The implant processes used to form the device wells may be compatible or the same as processes used to form other similar types of wells in the device. For example, the processes may be compatible with those used in current CMOS processes for forming similar types of wells. For example, the device well may be formed at the same time as the low voltage device or intermediate voltage device well. This allows the same lithographic mask of the current CMOS implant mask to be used to pattern the implant mask for the device well. For example, the current CMOS implant mask may be customized to include the device well opening. In other embodiments, a separate device well mask may be used to specifically tailor for the doping of the device well. In such cases, the same mask can also be used to form the second device well.

An anneal is performed. In one embodiment, the anneal is performed after the drift and device wells are formed. The anneal activates the dopants. In other embodiments, separate anneals may be performed for the drift and device wells. For example, an anneal may be performed after forming a doped well.

Figure 4D:
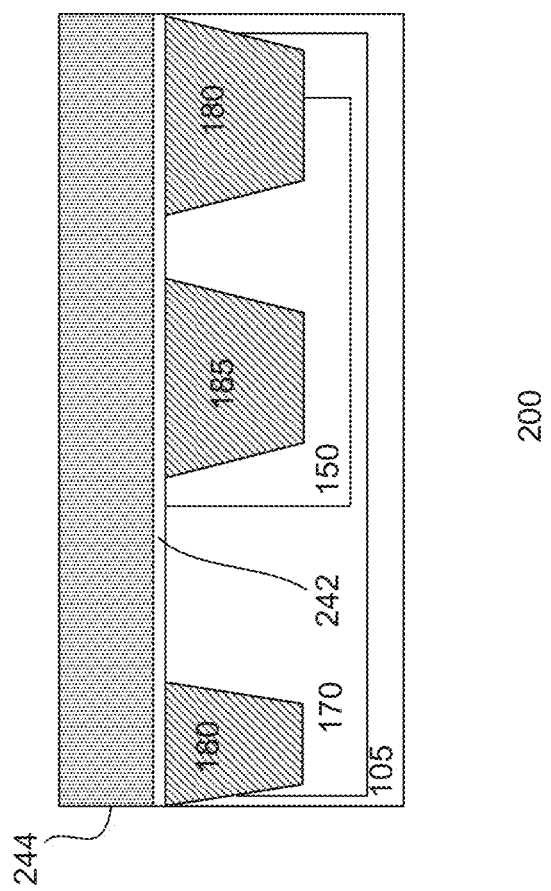

As shown in FIG. 4d, gate layers of a gate are formed on the substrate. In one embodiment, the gate layers include a gate dielectric layer 242 on the substrate and a gate electrode layer 244 thereon. The gate dielectric layer, for example, is silicon oxide. The thickness of the gate dielectric layer may be about 30-1000 Å. For example, the gate dielectric layer is a high voltage gate dielectric layer. The gate dielectric layer may be formed by thermal oxidation. For example, the dielectric layer is formed by wet oxidation followed by annealing the substrate in an oxidizing ambient. The temperature of the wet oxidation can be, for example, about 600-1000° C. The annealing can be, for example, performed at a temperature of about 1000° C.

As for the gate electrode layer, it may be polysilicon. The thickness of the gate electrode layer may be about 500-5000 Å. Other thickness may also be useful. The gate electrode layer may be formed by, for example, CVD. Other techniques for forming the gate electrode layer may also be useful. The gate electrode layer can be formed as an amorphous or non-amorphous layer. In one embodiment, the gate electrode layer is polysilicon doped with first type dopants. The concentration of dopants in the gate electrode layer may be about $1E14$-$1E15/cm^2$. Various techniques may be employed to dope the gate electrode, for example, in-situ doping or ion implantation.

Other types of gate dielectric and gate electrode materials or thicknesses may also be useful. For example, the gate dielectric material may be a high k dielectric material while the gate electrode may be a metal gate electrode material. Other configuration of gate layers may also be useful. For example, the gate dielectric and/or gate electrode layers may have multiple layers. The layers can be formed by various techniques, such as thermal oxidation, CVD and sputtering.

Figure 4E:
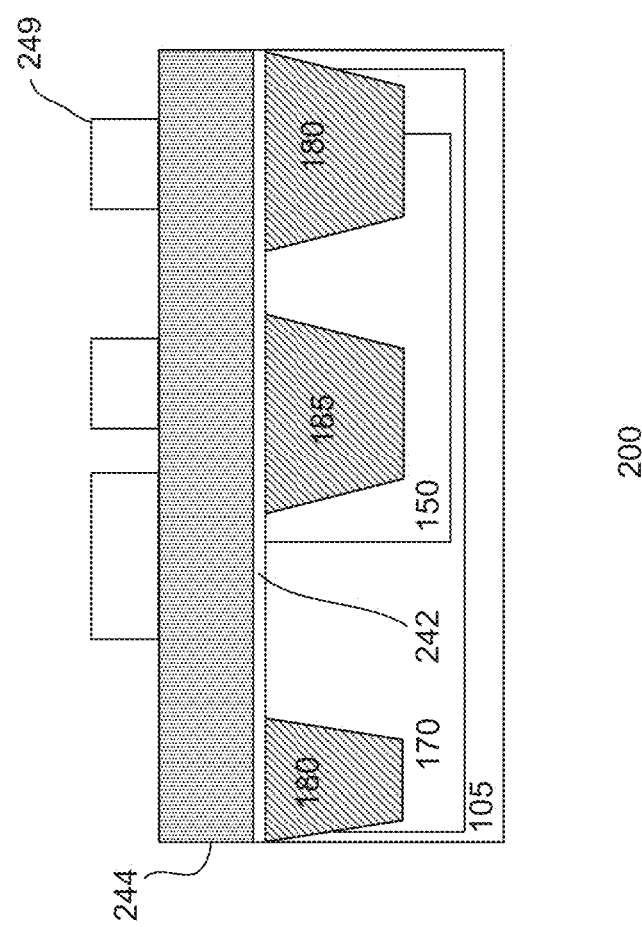

Referring to FIG. 4e, a mask layer 249 is formed on the substrate. The mask layer, for example, is formed over the gate electrode layer. In one embodiment, the mask layer is a soft mask layer, such as a photoresist layer. An exposure source may selectively expose the photoresist layer through a reticle containing the desired pattern. After selectively exposing the photoresist layer, it is developed to form openings corresponding to locations when the gate layers are to be removed. To improve lithographic resolution, an anti-reflective coating (ARC) may be used below the photoresist layer.

In other embodiments, the mask layer may be a hard mask layer. The hard mask layer, for example, may comprise TEOS or silicon nitride. Other types of hard mask materials may also be used. The hard mask layer may be patterned using a soft mask, such as a photoresist.

Figure 4F:
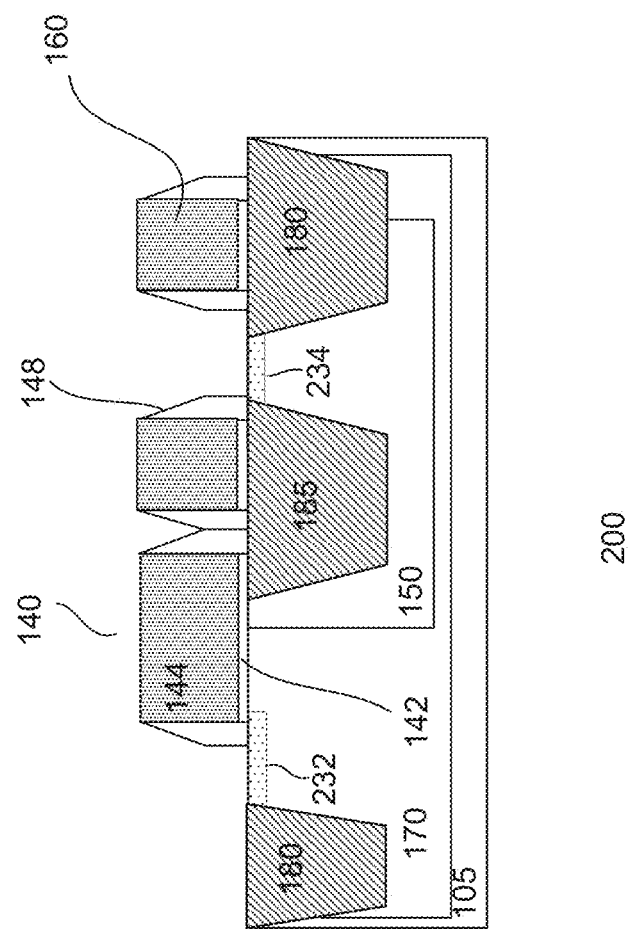

The patterned mask layer serves as an etch mask for a subsequent etch process, as shown in FIG. 4f. For example, the etch transfers the pattern of the mask to the gate layers. The etch removes the gate layers unprotected by the mask, exposing the substrate. The etch, for example, may be an anisotropic etch, such as reactive ion etch (RIE). Other types of etch processes may also be useful. In one embodiment, an RIE is employed to pattern the gate layers to form a gate 140. In one embodiment, the etch patterns the gate layers to form the gate and a field structure 160 surrounding a drain region of the substrate defined by the internal isolation and device isolation regions.

As described, the gate and field structure are formed in the same etch process using the gate layers. In other embodiment, the gate and field structure are formed using different processes. This allows the gate and field structure to have different materials. For example, after the gate is formed, a conductive layer is formed on the substrate and patterned to form the field structure. Other techniques for forming the gate and field structure using different processes may also be useful.

In one embodiment, lightly doped regions 232 and 234 are formed on the substrate in the source and drain regions of the device. The lightly doped regions have first polarity type dopants. To form the lightly doped regions, first polarity type dopants are implanted into the substrate. The implant, for example, may be self-aligned with respect to the device region. For example, the implant may be doped into the substrate unprotected by the gate, field structure and isolation regions. The depth of the lightly doped regions, for example, is about 0.1-0.4 µm. The implant dose may be from about 5E12-5E13/cm$^2$ and the implant energy may be from 10-100 KeV. Other implant parameters may also be useful.

Sidewall spacers 148 are formed on the sidewalls of the gates and the field structure. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. The thickness of the dielectric layer may be, for example, 300-1000 Å. Other thickness for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. In some applications, the spacer may be formed from multiple dielectric layers.

Figure 4G:
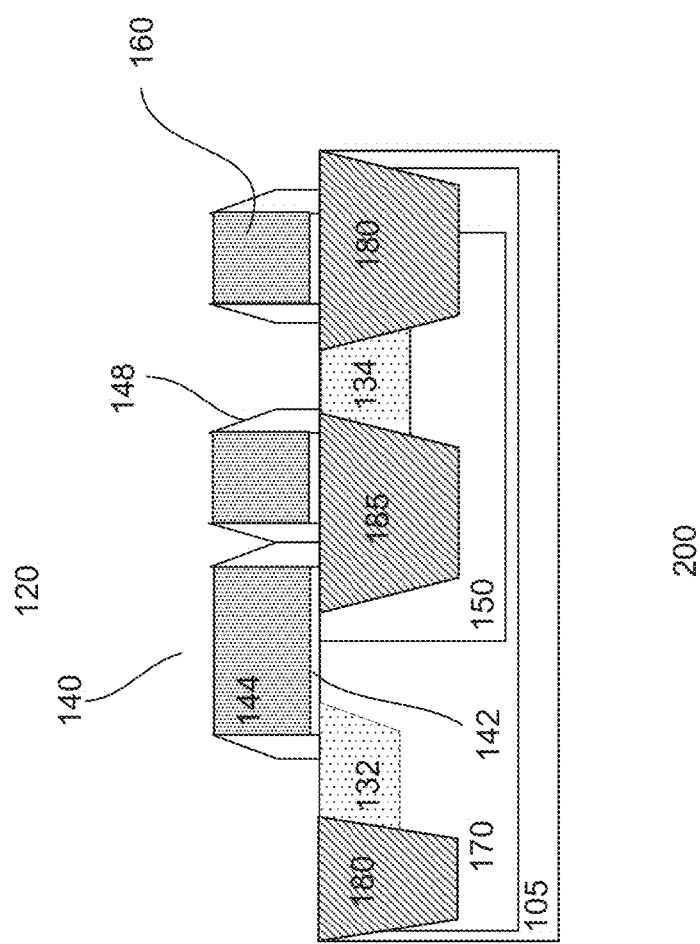

Referring to FIG. 4g, heavily doped regions 132 and 134 are formed in the source and drain regions on the substrate. The heavily doped regions have first polarity type dopants. Forming the heavily doped regions include implanting first polarity type dopants into the substrate. The implant, like the one that forms the lightly doped regions, is self-aligned with respect to the device region. For example, the implant may be doped into the substrate unprotected by the gate, field structure and isolation regions. In this case, the sidewall spacers cause the heavily doped source region to be offset, creating a source which includes a lightly doped source portion and a heavily doped deeper portion. The depth of the lightly doped regions, for example, is about 0.1-0.4 µm. The implant dose may be about 5E12-5E13/cm$^2$ and the implant energy may be about 10-100 KeV. Other implant parameters may also be useful. This forms a LD transistor 120.

Figure 4H:
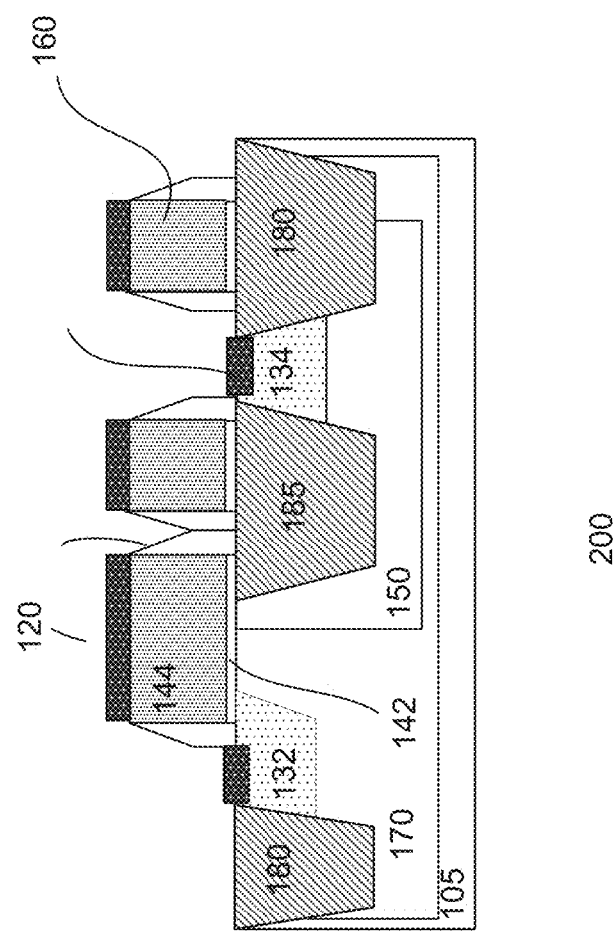

In one embodiment, salicide contacts 128 are formed on contact regions of the transistor as shown in FIG. 4h. For example, the salicide contacts are formed on the gate and source and drain of the transistor. In one embodiment, a salicide contact is also formed over the field structure. The salicide contacts are to facilitate low resistance contacts between the active substrate and the BEOL metal lines. In one embodiment, the thickness is about 200 Å. Providing other thicknesses may also be useful.

To form the salicide contacts, a metal layer is deposited on the surface of the substrate. The metal layer, for example, may be nickel or an alloy thereof. Other types of metallic layers, such as cobalt, or alloys thereof, including nickel, may also be used. The metal layer can be formed by Physical Vapor Deposition (PVD). Other types of metal elements and/or be formed by other types of processes can also be useful.

A first anneal may be performed. The first anneal diffuses the metal dopants into the active substrate, forming a silicided layer. The first anneal, for example, is performed at a temperature of about 300-600° C. for about 10-60 seconds. Excess metal not used in the silicidation of the active surface is removed by, for example, a wet removal process. For example, unreacted metal material is removed selective to the salicide contacts. A second anneal may be performed to enhance the material properties of the silicided layer, for example, lower resistivity. The first and second annealing processes may be a rapid thermal anneal (RTA). Other annealing parameters or techniques may also be useful to form the salicide contacts.

Figure 4I:
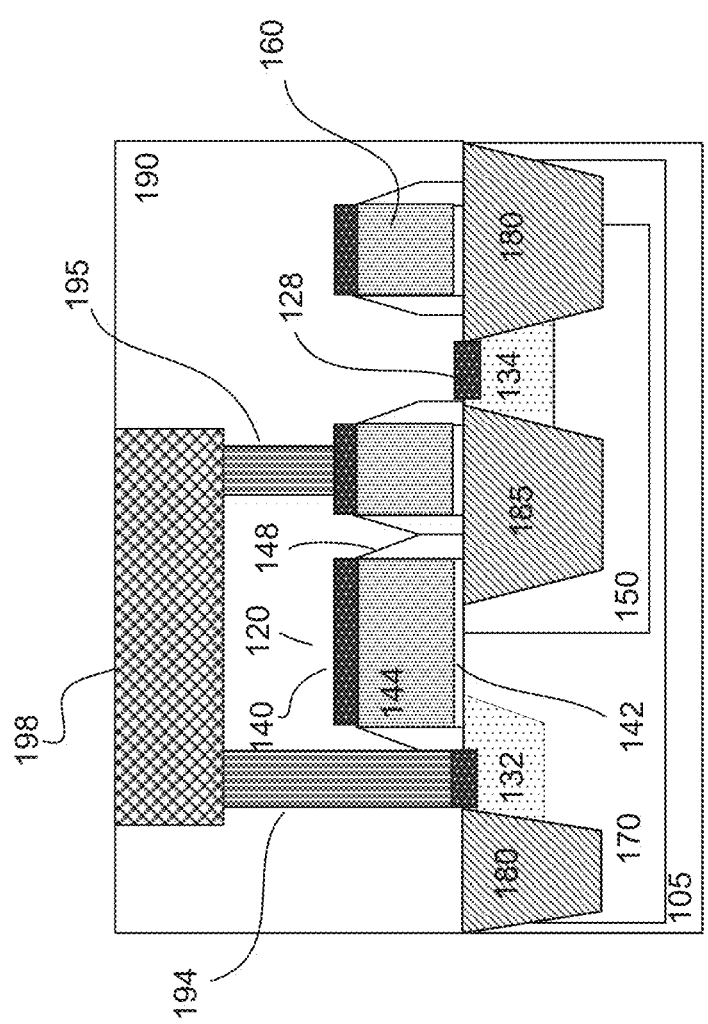

Referring to FIG. 4i, a dielectric layer 190 is formed on the substrate, covering the transistor. A dielectric etch stop layer may be formed over the transistors prior to forming the dielectric layer. The etch stop layer, for example, is a silicon nitride etch stop layer. Other types of etch stop layers may also be useful. The etch stop layer should have a material which can be selectively removed from the dielectric layer thereover. The etch stop layer facilitates in forming via plugs to contact regions of the transistor, such as the gate electrode and S/D regions. In some embodiments, the etch stop layer may also serve as a stress layer for applying a stress on the channel of the transistor to improve performance. Various techniques, such as CVD, may be employed to form the etch stop layer.

The dielectric layer serves as an interconnect dielectric layer in which interconnects are formed to couple to the various contact regions or terminals of the transistor. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG). The dielectric layer should be capable of selectively etched or patterned with respect to the etch stop layer.

The dielectric layer includes upper and lower portions. The upper portion serves as an intra-metal dielectric (IMD) layer in which conductive lines are formed. The lower portion serves as an interlevel dielectric (ILD) layer in which contact plugs are formed. In one embodiment, the ILD layer is a pre-metal dielectric (PMD) layer in which contact plugs are formed to contact regions on the substrate, such as contact regions to the transistors, including the source, drain and gate.

In one embodiment, the upper and lower portions are separate portions. For example, the conductive lines and plugs are formed using separate processes, such as single damascene processes. For example, via openings are formed in the PMD layer using, for example, mask and etch processes, such as RIE. The via openings are filled with a conductive material. Excess conductive material is removed by, for example, CMP to form a planar top surface with exposed contact plugs in the via openings. Thereafter, the IMD layer is formed over the PMD layer. Trenches are formed in the IMD layer using mask and etch processes. The trenches correspond to conductive lines and are in communication with contact plugs in the PMD layer. The trenches are filled with a conductive material. Excess conductive materials are removed by, for example, CMP to provide a planar top surface with exposed interconnect lines. Other techniques for forming the conductive lines and plugs as well as the use of other types of conductive materials may also be useful. For example, reactive ion etch (RIE) techniques may also be used or a combination of RIE and damascene techniques may also be useful.

For the case where the contact plugs and conductive lines are formed using separate processes, the conductive material of the plugs and lines may be different. In one embodiment, the contact plugs are tungsten (W) plugs while the conductive lines are copper lines. Other types of materials for the plugs and conductive lines are also useful. For example, the conductive lines may be aluminum lines. In other embodiments, the conductive lines and plugs may be formed using a dual damascene process. In such cases, the conductive lines and plugs are of the same material.

In one embodiment, contact plugs 194 and 195 are formed in the lower portion of the dielectric layer. The contact plugs are coupled to the source and to the field structure. The contact plugs are interconnected by a conductive line 198 in the upper portion of the dielectric layer. This interconnects the field structure to the source. In other embodiments, the source and field structure are not interconnected. In such cases, the field structure is interconnected to a low potential source which is lower than the drain. In one embodiment, the field structure is interconnected to ground or 0V. Coupling the field structure to other low potential sources is also useful.

In other embodiments, a well contact is provided. The well contact is disposed in the device well from a surface portion of the substrate. The well contact, in one embodiment, is heavily doped with second polarity typed dopants. For example, the well contact region is a p$^+$ contact for an n-type transistor. Providing a n$^+$ contact may also be useful for a p-type transistor. Other dopant concentrations for the well contact may also be useful. The depth of the well contact, for example, may be about the same as the source or drain. Providing a contact having other depths may also be useful. The well contact provides a contact to the device well to, for example, bias the device well.

The well contact, in one embodiment, is isolated from the source by an internal isolation region. In some embodiments, no internal isolation region is provided to separate the well contact and source. Other configurations of the source and well contact may also be useful.

In one embodiment, the well contact, the source and the field structure 160 are commonly coupled. For example, a conductive line disposed in a dielectric layer may be used to commonly couple the source, field structure and well tap region by contact plugs. The device well, source and field structure, for example, may be coupled to the second opposite potential. In other embodiments, the field structure may be coupled to either the device well contact or the source. Other configurations of coupling the well contact, source and field structure may also be useful.

Figure 5A:
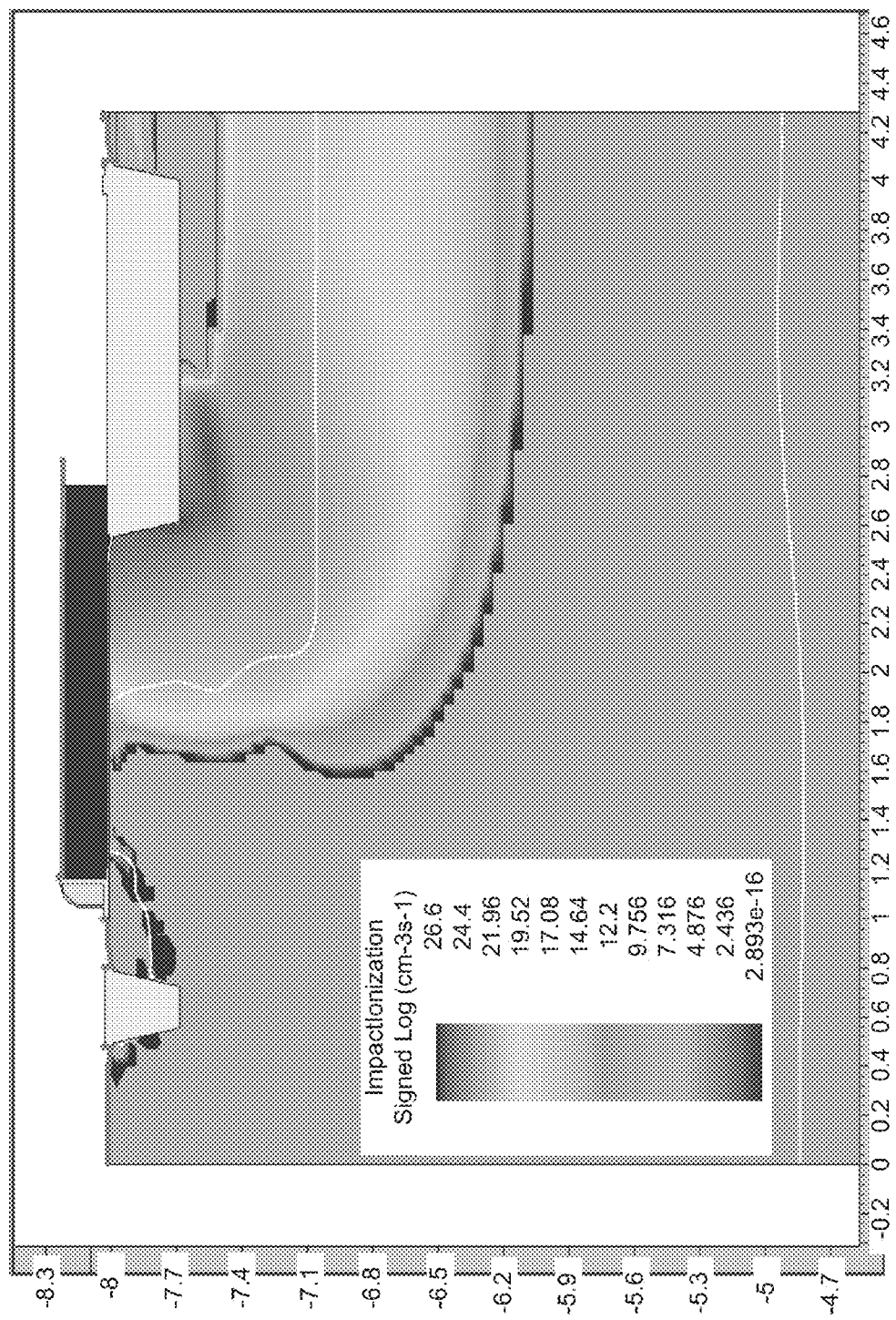
FIGS. 5a-b show impact ionization of devices.
Figure 5B:
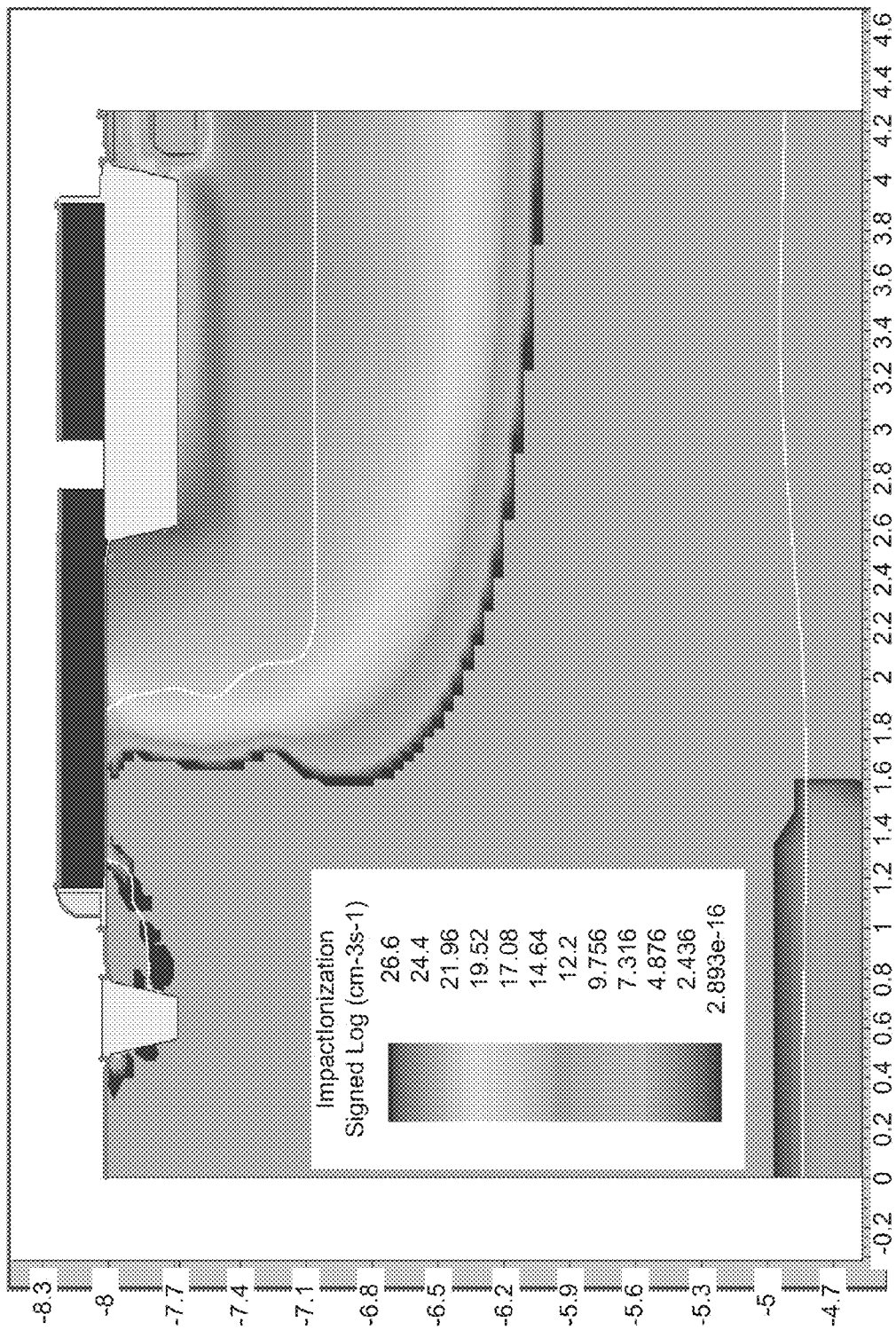

FIGS. 5*a*-*b* show impact ionization of transistors with and without a field structure. Referring to FIG. 3*a*, impart ionization 330 of the transistor 120 without a field structure is concentrated at a drain side of the gate. On the other hand, impact ionization 340 of the transistor of FIG. 3*b* with the field structure is distributed across the substrate from the drain to the gate. By distributing the impact ionization across the substrate, for example, from the drain side of the gate and under the isolation region to the drain, an increase in dielectric breakdown voltage can be achieved.

Table 1 shows TCAD simulation results of a transistor with and without the field structure. The dimensions of the transistors are identical. As can be seen, the breakdown voltage increases from 29.3 V to 34.5 V by employing a field structure.

TABLE 1

| Device parameter | Without field structure | With field structure |
| --- | --- | --- |
| Idlin(uA/um) | 12 | 12 |
| Breakdown Voltage(V) | 29.3 | 34.5 |

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
  a substrate having a device region, wherein the device region comprises a source region, a gate region and a drain region defined thereon;
  a gate disposed on the gate region;
  a field structure surrounding the drain region without surrounding the source region;
  a source and a drain in the source region and drain region, wherein the drain is separated from the gate on a second side of the gate and the source is adjacent to a first side of the gate; and
  an interconnection to the field structure, the interconnection is coupled to a potential, wherein the potential distributes the electric field across the substrate between the second side of the gate and the drain.

2. The device of claim 1 wherein the field structure is a conductive ring structure disposed on the substrate and surrounds the drain.

3. The device of claim 1 comprising an internal device isolation region along a channel width direction in the substrate between the gate and the drain.

4. The device of claim 3 comprising a drift well in the substrate between the gate and drain region and underlaps a portion of the gate.

5. The device of claim 4 wherein the drift well encompasses the drain and internal device isolation region.

6. The device of claim 4 comprising an isolation region, wherein the isolation region isolates the device region from other regions of the device.

7. The device of 6 comprising a device well, wherein the device well is disposed within the isolation region.

8. The device of claim 7 wherein the device well encompasses the source, drain, drift well and internal device isolation region.

9. The device of claim 7 wherein the device well comprises second polarity type dopants and the drift well comprises first polarity type dopants, wherein the first and second polarity types are different.

10. The device of claim 9 comprising a well contact which is disposed in the device well from a surface portion of the substrate and the well contact comprises heavily doped second polarity type dopants.

11. The device of claim 10 wherein the well contact, source and field structure are commonly coupled to a conductive line through contact plugs.

12. The device of claim 7 wherein the drift well is about the same depth as the device well.

13. The device of claim 1 wherein the device is a NMOS transistor.

14. The device of claim 13 wherein the potential to which the interconnection is coupled is lower than a potential coupled to the drain.

15. The device of claim 1 wherein the device is a PMOS transistor.

16. The device of claim 15 wherein the potential to which the interconnection is coupled is higher than a potential coupled to the drain.

17. The device of claim 1 wherein:
the field structure comprises a gate electrode and a gate dielectric under the gate electrode; and
the source and field structure are commonly coupled to a conductive line through contact plugs.

18. A device comprising:
a substrate having a device region, wherein the device region comprises a source region, a gate region and a drain region defined thereon, and wherein the substrate comprises a base substrate and a surface substrate disposed over the base substrate, the surface substrate comprises lightly doped second polarity type dopants;
a gate disposed on the gate region;
a field structure surrounding the drain region;
a source and a drain in the source region and drain region, wherein the drain is separated from the gate on a second side of the gate and the source is adjacent to a first side of the gate; and
an interconnection to the field structure, the interconnection is coupled to a potential, wherein the potential distributes the electric field across the substrate between the second side of the gate and the drain.

19. The device of claim 1 wherein the substrate comprises a base substrate, a surface substrate having lightly doped second polarity type dopants disposed over the base substrate and a buried well disposed between the base and surface substrate, wherein the buried well comprises heavily doped first polarity type dopants.

20. A device comprising:
a substrate having a device region, wherein the device region comprises a gate and first and second doped regions disposed in the substrate, wherein the second doped region is separated from the gate on a second side of the gate and the first doped region is adjacent to a first side of the gate;
a field structure surrounding only the second doped region without surrounding the first doped region; and
an interconnection to the field structure, the interconnection is coupled to a potential, wherein the potential distributes the electric field across the substrate between the second side of the gate and the second doped region.

* * * * *